(12) United States Patent
Qiao et al.

(10) Patent No.: US 11,400,696 B2
(45) Date of Patent: Aug. 2, 2022

(54) BONDING DEVICES AND BONDING METHODS FOR IRREGULAR-SHAPED CURVED COVER PLATES AND FLEXIBLE SCREENS

(71) Applicant: Yungu (Gu'an) Technology Co., Ltd., Langfang (CN)

(72) Inventors: Guizhou Qiao, Langfang (CN); Jianping Chen, Langfang (CN); Xiuyu Zhang, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 28 days.

(21) Appl. No.: 16/699,759

(22) Filed: Dec. 2, 2019

(65) Prior Publication Data

US 2020/0101712 A1   Apr. 2, 2020

Related U.S. Application Data

(63) Continuation of application No. PCT/CN2018/111277, filed on Oct. 22, 2018.

(30) Foreign Application Priority Data

Apr. 20, 2018  (CN) .......................... 201810360437.4

(51) Int. Cl.
*B32B 37/10*  (2006.01)
*H01L 51/00*  (2006.01)
(Continued)

(52) U.S. Cl.
CPC ...... *B32B 37/1009* (2013.01); *H01L 51/0097* (2013.01); *H01L 51/524* (2013.01);
(Continued)

(58) Field of Classification Search
None
See application file for complete search history.

(56) References Cited

U.S. PATENT DOCUMENTS

2016/0202728 A1   7/2016  Kim
2017/0293194 A1*  10/2017  Hou .................... H01L 51/0097

FOREIGN PATENT DOCUMENTS

CN        103778857 A    5/2014
CN        107016936 A    8/2017
(Continued)

OTHER PUBLICATIONS

Machine translation CN 107016936A.*
(Continued)

*Primary Examiner* — Christopher T Schatz
(74) *Attorney, Agent, or Firm* — Kilpatrick Townsend & Stockton

(57) ABSTRACT

A bonding device and a bonding method for an irregular-shaped curved cover plate and a flexible screen are disclosed. The bonding device includes a bonding body pressing the flexible screen, the bonding body includes: an adsorption component configured to adsorb the flexible screen, the adsorption component includes a plurality of sub-adsorption components arranged apart from each other; and an expansion component having a variable size, the expansion component includes a plurality of sub-expansion components arranged apart from each other. The adsorption component and the expansion component are cooperatively provided with a pressing surface having a shape adapted to a shape of an inner surface of the irregular-shaped curved cover plate.

9 Claims, 7 Drawing Sheets

(51) Int. Cl.
      *H01L 51/52*       (2006.01)
      *H01L 51/56*       (2006.01)

(52) U.S. Cl.
      CPC .......... *H01L 51/56* (2013.01); *B32B 2457/20* (2013.01); *H01L 2251/5338* (2013.01)

(56) References Cited

FOREIGN PATENT DOCUMENTS

| | | | | |
|---|---|---|---|---|
| CN | 107020785 | A | 8/2017 | |
| CN | 107379567 | A | 11/2017 | |
| CN | 207148798 | U | 3/2018 | |
| CN | 108615465 | A | 10/2018 | |
| KR | 20150034048 | A | 4/2015 | |
| KR | 101899936 | B1 * | 11/2018 | ............... B30B 5/02 |
| WO | 2019200866 | A1 | 10/2019 | |

OTHER PUBLICATIONS

International Search Report dated Jan. 23, 2019 in the corresponding International application (application No. PCT/CN2018/111277).

CN First Office Action with search report dated Feb. 28, 2019 in the corresponding CN application (application No. 201810360437.4).

CN Second Office Action with search report dated Jun. 27, 2019 in the corresponding CN application (application No. 201810360437.4).

\* cited by examiner

BONDING DEVICES AND BONDING METHODS FOR IRREGULAR-SHAPED CURVED COVER PLATES AND FLEXIBLE SCREENS

CROSS-REFERENCE TO RELATED APPLICATIONS

The present application is a continuation of International Application No. PCT/CN2018/111277 filed on Oct. 22, 2018, which claims priority to Chinese patent application No. 201810360437.4, filed on Apr. 20, 2018. Both applications are incorporated herein by reference in their entireties.

TECHNICAL FIELD

The present disclosure relates to a flexible screen bonding technology.

BACKGROUND TECHNOLOGY

The flexible screen is a new growth point of the future industry, and the characteristic of flexibility of the flexible screen is continuously exploited and utilized. For example, a product, prepared by attaching the flexible screen to a three dimensional (3D) fixed curved cover plate (The profile of both sides of the cover plate are a quarter of circle arc), can display image on the front and sides.

At present, a bonding method of the flexible screen is to press the flexible onto the inner side of a glass cover plate via a silicon pad.

SUMMARY

Accordingly, it is necessary to provide a bonding device and a bonding method for a curved screen which can avoid interference during bonding, in view of the problem of interference during bonding.

A bonding device for an irregular-shaped curved cover plate and a flexible screen, the irregular-shaped curved cover plate includes a flat area and arc hook areas located on both sides of the flat area and smoothly transitioning with the flat area;

the bonding device for the irregular-shaped curved cover plate and the flexible screen includes a bonding body configured to press the flexible screen, the bonding body includes:

an adsorption component configured to adsorb the flexible screen, the adsorption component includes a plurality of sub-adsorption components arranged apart from each other; and an expansion component having a variable size, the expansion component includes a plurality of sub-expansion components arranged apart from each other;

the adsorption component and the expansion component are cooperatively provided with a pressing surface having a shape adapted to a shape of an inner surface of the irregular-shaped curved cover plate; the expansion component has a normal state in which a size of the pressing surface is less than a size of the inner surface of the irregular-shaped curved cover plate and an expanded state in which the size of the pressing surface is adapted to the size of the inner surface of the irregular-shaped curved cover plate.

In one of the embodiments, the plurality of sub-adsorption components and the plurality of sub-expansion components both have a strip shape.

In one of the embodiments, the sub-adsorption components and the sub-expansion components are alternately arranged with each other.

In one of the embodiments, the sub-expansion component has a width greater than a width of the sub-adsorption component.

In one of the embodiments, each of the sub-adsorption components is provided with a plurality of vacuum adsorption holes arranged linearly on a surface thereof.

In one of the embodiments, the sub-expansion component is made of a rubber material, and each of the sub-expansion components is provided with an inflation hole.

In one of the embodiments, the bonding body further includes a support body configured to support the pressing surface.

In one of the embodiments, the support body includes a lateral extending body adapted to a direction of the flat area of the irregular-shaped curved cover plate, and a longitudinal extending body configured to support the lateral extending body. The pressing surface is formed on the lateral extending body.

In one of the embodiments, at least a portion of the lateral extending body is made of the same material as the expansion component.

In one of the embodiments, the longitudinal extending body is provided with an inflation air passage in communication with the expansion component, and an evacuated air passage in vacuum communication with the adsorption component.

In one of the embodiments, the bonding device for the irregular-shaped curved cover plate and the flexible screen further includes a cover plate positioning fixture configured to position the irregular-shaped curved cover plate.

In addition, a method of bonding an irregular-shaped curved cover plate and a flexible screen is further provided, which includes: providing a flexible screen, an irregular-shaped curved cover plate, and a bonding device for the irregular-shaped curved cover plate and the flexible screen; the irregular-shaped curved cover plate includes a flat area and arc hook areas located on both sides of the flat area and smoothly transitioning with the flat area, the bonding device includes a bonding body configured to press the flexible screen, the bonding body includes a pressing surface, and an expansion component having a variable size;

adsorbing the flexible screen on an outer side of the pressing surface of the bonding body to obtain an initial body; and inserting the initial body into an inner side of the irregular-shaped curved cover plate, and then expanding the expansion component to press the flexible screen onto the irregular-shaped curved cover plate, until the bonding of the irregular-shaped curved cover plate and the flexible screen is completed.

In one of the embodiments, the expanding the expansion component includes: filling gas into the expansion component to expand the expansion component.

In one of the embodiments, the expansion component includes a plurality of sub-expansion components, the expanding the expansion component includes: providing a telescopic member in an interior of each of the sub-expansion components, when the telescopic member is extended, applying pressure to an inner wall of the sub-expansion component to increase a volume of the sub-expansion component.

In one of the embodiments, prior to expanding the expansion component, the method further includes: reducing an adsorption pressure of vacuum adsorption.

In one of the embodiments, the adsorption is vacuum adsorption, and an adsorption pressure ranges from −60 kPa to −80 kPa.

In one of the embodiments, the reducing the adsorption pressure of the vacuum adsorption includes reducing the adsorption pressure to −5 kPa to −20 kPa.

In one of the embodiments, the initial body is translated from an end of the irregular-shaped curved cover plate into an inner side of the irregular-shaped curved cover plate, or is inserted from a side of the irregular-shaped curved cover plate into the inner side of the irregular-shaped curved cover plate.

In the bonding device for the irregular-shaped curved cover plate and the flexible screen applied with the technical solution according to the present disclosure, the bonding body is used for both adsorbing and pressing the flexible screen. The plurality of sub-adsorption components arranged apart from each other are used for adsorbing the flexible screen. When the expansion component is in the expanded state, the pressing surface presses the flexible screen to sufficiently attach the irregular-shaped curved cover plate to the flexible screen, further improving the bonding effect.

In the method of bonding the irregular-shaped curved cover plate and the flexible screen applied with the technical solution according to the present disclosure, the initial body is translated from an end of the irregular-shaped curved cover plate into an inner side of the irregular-shaped curved cover plate, or is inserted from a side of the irregular-shaped curved cover plate into the inner side of the irregular-shaped curved cover plate, such that both ends of the flexible screen are prevented from interfering with both ends of the irregular-shaped curved cover plate. In addition, in the aforementioned bonding method, the arc hook areas of the irregular-shaped curved cover plate can be sufficiently attached, thereby further improving the bonding effect.

DETAILED DESCRIPTION OF THE EMBODIMENTS

A conventional bonding device can only perform bonding of the 3D fixed curved cover plate, when the cover plate is designed to be bent inwardly, that is, when the cover plate has an irregular shape, the bonding cannot be implemented by the conventional bonding device. Therefore, novel bonding techniques are desired.

The above objects, features and advantages of the present disclosure will become more apparent by describing in detail embodiments thereof with reference to the accompanying drawings. Numerous specific details are set forth in the description below in order to provide a thorough understanding of the disclosure. However, the present disclosure can be implemented in many other ways than those described herein, and those skilled in the art can make similar modifications without departing from the scope of the present disclosure, and thus the present disclosure is not limited by the specific embodiments disclosed below.

Figure 1:
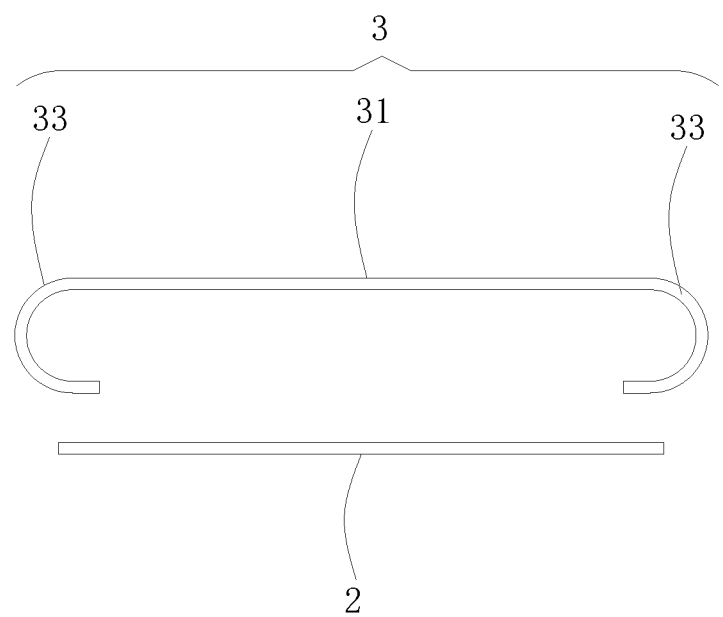
FIG. 1 is a schematic view of a flexible screen and an irregular-shaped curved cover plate.
Figure 2:
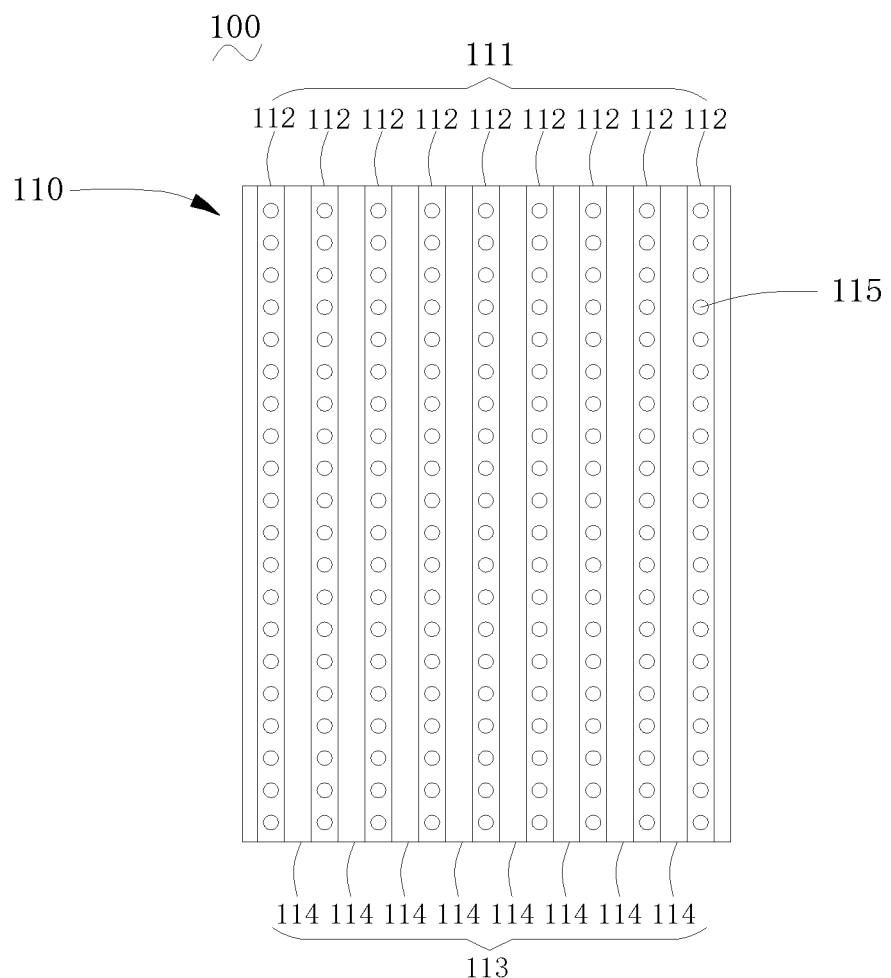
FIG. 2 is a top plan view of a bonding device for an irregular-shaped curved cover plate and a flexible screen according to an embodiment of the present disclosure.
Figure 3:
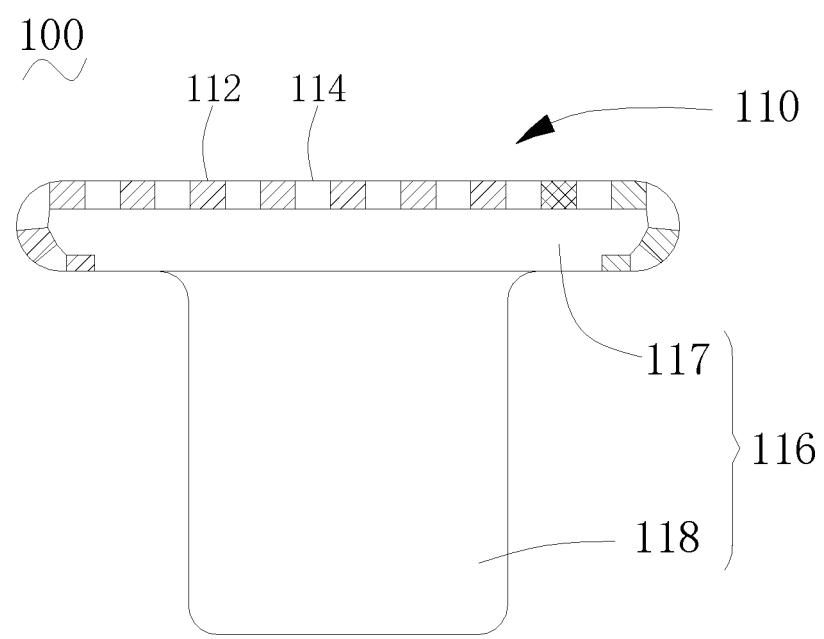
FIG. 3 is a front elevation view of a bonding device for an irregular-shaped curved cover plate and a flexible screen according to an embodiment of the present disclosure.

Referring to FIG. 1 to FIG. 3, a bonding device 100 for an irregular-shaped curved cover plate and a flexible screen according to an embodiment of the present disclosure is shown, which is used to bond a flexible screen 2 to an inner side of an irregular-shaped curved cover plate 3. The irregular-shaped curved cover plate 3 includes a flat area 31 with a planar shape, and arc hook areas 33 located on both sides of the flat area 31 and smoothly transitioning with the flat area 31. In other words, the flat area 31 is located in a center position, and two arc hook areas 33 are formed by bending both sides of the flat area 31 inwardly, respectively. Preferably, in the illustrated embodiment, the arc hook area 33 has a shape of semi-circular that is tangential to the flat area 31.

The bonding device 100 for the irregular-shaped curved cover plate and the flexible screen includes a bonding body 110 used for pressing the flexible screen. A shape of one side of the bonding body 110 is adapted to a shape of the irregular-shaped curved cover plate 3, referring to FIG. 3, a shape of a top of the bonding body 110 is adapted to the shape of the irregular-shaped curved cover plate 3. The bonding body 110 includes an adsorption component 111 used for adsorbing the flexible screen and an expansion component 113 having a variable size.

The adsorption component 111 includes a plurality of sub-adsorption components 112 arranged apart from each other. Since the plurality of sub-adsorption components 112 are arranged apart from each other, a wide adsorption force can be applied to the flexible screen 2, thereby facilitating overall adsorption of the flexible screen 2.

In addition, an adsorption mechanism may be employed to integrally control the plurality of sub-adsorption components 112 described above. For example, an interior of the bonding body 110 has a vacuum chamber in communication with the plurality of sub-adsorption components 112. At this time, the degree of vacuum of the plurality of sub-adsorption components 112 can be controlled simultaneously by controlling the degree of vacuum in the vacuum chamber, thereby applying a uniform adsorption force to the flexible screen 2.

Of course, each of the sub-adsorption components 112 can also be individually controlled by using a plurality of adsorption mechanisms. This allows a reasonable adsorption force to be applied depending on the degree of bending at different positions on the flexible screen 2.

The expansion component 113 includes a plurality of sub-expansion components 114 arranged apart from each other. The expansion component 113 refers to a unit that can expand to increase a contact area with the flexible screen 2.

The adsorption component 111 and the expansion component 113 are cooperatively provided with a pressing surface having a shape adapted to a shape of an inner surface of the irregular-shaped curved cover plate 3. The expansion component 113 has a normal state in which a size of the pressing surface is less than a size of the inner surface of the irregular-shaped curved cover plate 3 and an expanded state in which the size of the pressing surface is adapted to the size of the inner surface of the irregular-shaped curved cover plate 3. When the expansion component 113 is in the expanded state, the bonding body 110 presses the flexible screen 2 to press the flexible screen 2 onto the irregular-shaped curved cover plate 3.

Specifically, since the flexible screen 2 is attached to a surface of the bonding body 110, when the expansion component 113 expands, a volume of the bonding body 110 increases, and pressure can be applied to the flexible screen 2 attached to the surface of the bonding body 110, thereby pressing the flexible screen 2 onto the irregular-shaped curved cover plate 3.

In addition, an expansion mechanism may be used to integrally control the plurality of sub-expansion components 114 described above, and each of the sub-expansion components 114 may also be individually controlled by using a plurality of expansion mechanisms. The expansion mechanism may be located in the vacuum chamber of the bonding body 110 or may be externally connected.

Based on the foregoing embodiments, referring to FIG. 2, the plurality of sub-adsorption components 112 and the plurality of sub-expansion components 114 both have a strip shape. Since the plurality of sub-adsorption components 112 and the plurality of sub-expansion components 114 both have the strip shape, the degree of vacuum in the entire sub-adsorption component 112 can be controlled.

In addition, in the present embodiment, both the strip-shaped sub-adsorption component 112 and the strip-shaped sub-expansion component 114 extend along a top-to-down direction in FIG. 2, but are not limited therein, and may both extend along a left-to-right direction.

Of course, the forms of the sub-adsorption component 112 and the sub-expansion component 114 are not limited therein. For example, the cross-sections of the sub-adsorption component 112 and the sub-expansion component 114 may also be independently selected from any one of a circle, a square, a rectangle, and a diamond. The cross-sections of both can also be other irregular shapes.

Based on the foregoing embodiments, referring to FIG. 2, the sub-adsorption components 112 and the sub-expansion components 114 are alternately arranged with each other. When the flexible screen 2 is adsorbed, the alternate arrangement of the two is advantageous for applying a relatively uniform adsorption force to the flexible screen 2. When the flexible screen 2 is attached, the alternate arrangement of the two is advantageous for applying a relatively uniform attaching force to the flexible screen 2.

Of course, the arrangement of the sub-adsorption component 112 and the sub-expansion component 114 is not limited therein. For example, the plurality of sub-adsorption components 112 may also be arranged in rows and columns, and the sub-expansion components 114 are interposed between the plurality of sub-adsorption components 112.

Based on the foregoing embodiments, the sub-expansion component 114 has a width greater than a width of the sub-adsorption component 112. This is advantageous in increasing a contact area between the sub-expansion component 114 and the flexible screen 2, thereby increasing the pressure applied to the flexible screen 2 at the time of attaching, so as to improve the bonding effect.

Based on the foregoing embodiments, each of the sub-adsorption components 112 is provided with a plurality of vacuum adsorption holes 115 arranged linearly on a surface thereof. The arrangement of the plurality of vacuum adsorption holes 115 arranged linearly is relatively regular, which is advantageous for applying a relatively uniform adsorption force to the flexible screen 2.

Based on the foregoing embodiments, the sub-expansion components 114 are made of a rubber material, and each of the sub-expansion components 114 is provided with an inflation hole. That is, the entire sub-expansion component 114 is made of rubber, and the sub-expansion component 114 can be inflated and deflated through the inflation hole. Since the elasticity of the rubber is good, the volume change of the sub-expansion component 114 is large, and the volume change of the bonding body 110 before and after the bonding is large, and the bonding effect can be further improved.

Referring to FIG. 3, based on the foregoing embodiments, the bonding body 110 further includes a support body 116 used for supporting the pressing surface. The support body 116 functions to support the pressing surface while also supporting the adsorption component 111 and the expansion component 113.

Based on the foregoing embodiments, the support body 116 includes a lateral extending body 117 adapted to a direction of the flat area 31 of the irregular-shaped curved cover plate 3, and a longitudinal extending body 118 configured to support the lateral extending body 177. The pressing surface is formed on the lateral extending body 117. Specifically, an upper surface of the lateral extending body 177 is as shown in FIG. 3. More preferably, the lateral extending body 117 and the longitudinal extending body 118 are integrally formed.

Preferably, at least a portion of the lateral extending body 117 is made of the same material as the expansion component 114. Thus, when the expansion component 114 expands, at least a portion of the lateral extending body 117 can provide a certain cushioning effect on the expansion component 114, so that the expansion component 114 slowly presses against the flexible screen 2.

Preferably, the longitudinal extending body 118 is provided with an inflation air passage (not shown) in communication with the expansion component 114, and an evacuated air passage (not shown) in vacuum communication with the adsorption component 112. The inflation or deflation operation to the expansion component 114 may be provided by the inflation air passage described above. The adsorption component 112 can be vacuumed by the evacuated air passage described above.

Based on the foregoing embodiments, the bonding device 100 for the irregular-shaped curved cover plate and the flexible screen further includes a cover plate positioning fixture (not shown) configured to position the irregular-shaped curved cover plate. An arc surface is formed on an inner surface of the cover plate positioning fixture, and the curvature of the arc surface coincides with the curvature of the irregular-shaped curved cover plate 3.

In the aforementioned bonding device for the irregular-shaped curved cover plate and the flexible screen, the bonding body is used for both adsorbing and pressing the flexible screen. The plurality of sub-adsorption components arranged apart from each other are used for adsorbing the flexible screen. When the expansion component is in the expanded state, the pressing surface presses the flexible screen to sufficiently attach the irregular-shaped curved cover plate to the flexible screen, further improving the bonding effect.

In addition, the bonding device for the irregular-shaped curved cover plate and the flexible screen of the present disclosure can also effectively solve the problem of the bonding alignment between the irregular-shaped curved cover plate and the flexible screen, and improve the attachment yield and stability of the product.

Figure 4:
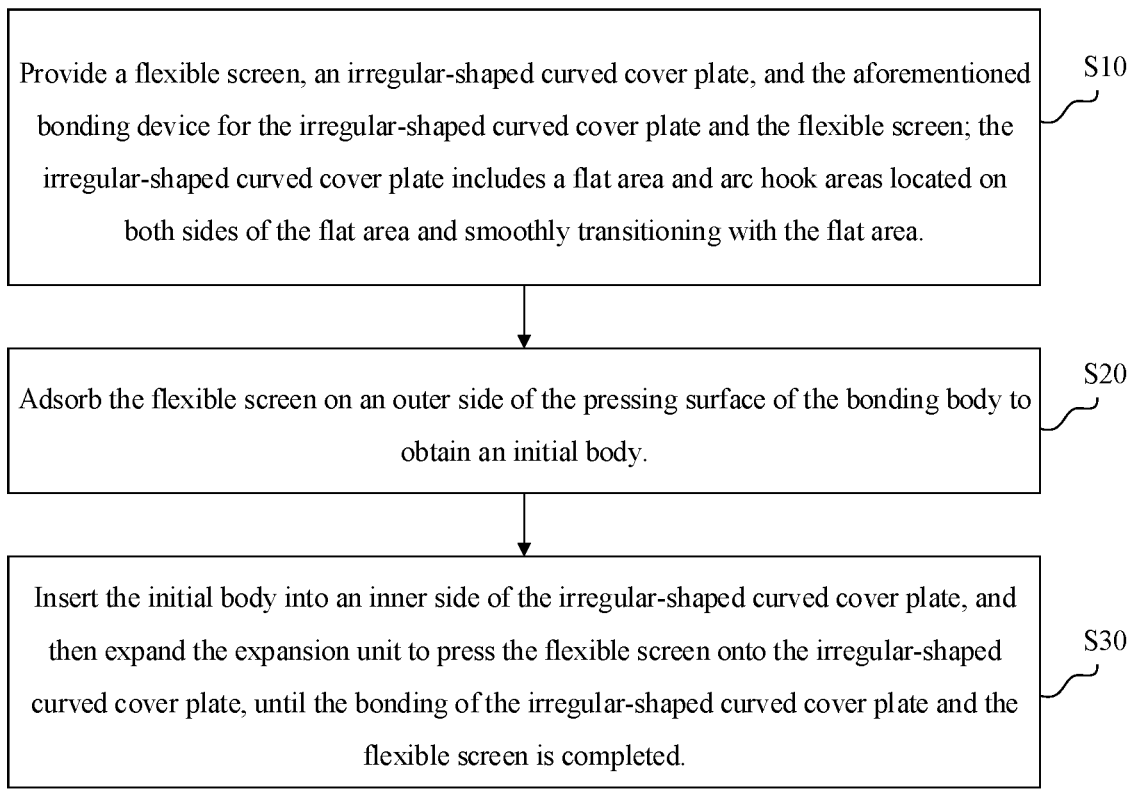
FIG. 4 is a flow chart of a method of bonding an irregular-shaped curved cover plate and a flexible screen according to an embodiment of the present disclosure.

Referring to FIG. 4, a method of bonding an irregular-shaped curved cover plate and a flexible screen according to an embodiment is shown, which includes the following steps:

In step S10, referring to FIG. 1 to FIG. 3 together, a flexible screen 2, an irregular-shaped curved cover plate 3, and the aforementioned bonding device 100 for the irregular-shaped curved cover plate and the flexible screen are provided. The irregular-shaped curved cover plate 3 includes a flat area 31 and arc hook areas 33 located on both sides of the flat area 31 and smoothly transitioning with the flat area 31.

The flexible screen 2 is preferably a flexible organic light-emitting diode (OLED) screen. Of course, it should be understood that the flexible screen 2 can also be other flexible screens.

Of course, a bonding adhesive layer for bonding the flexible screen 2 and the irregular-shaped curved cover plate 3 can also be provided. The bonding adhesive layer is used for bonding the flexible screen 2 and the irregular-shaped curved cover plate 3, so that the bonding adhesive layer can be pre-attached to the flexible screen 2 or pre-attached to the irregular-shaped curved cover plate 3.

The bonding adhesive layer is preferably an OCA adhesive layer. Of course, it should be understood that the bonding adhesive layer may also be selected from other suitable bonding adhesives, such as SCA adhesive layers.

Figure 5:
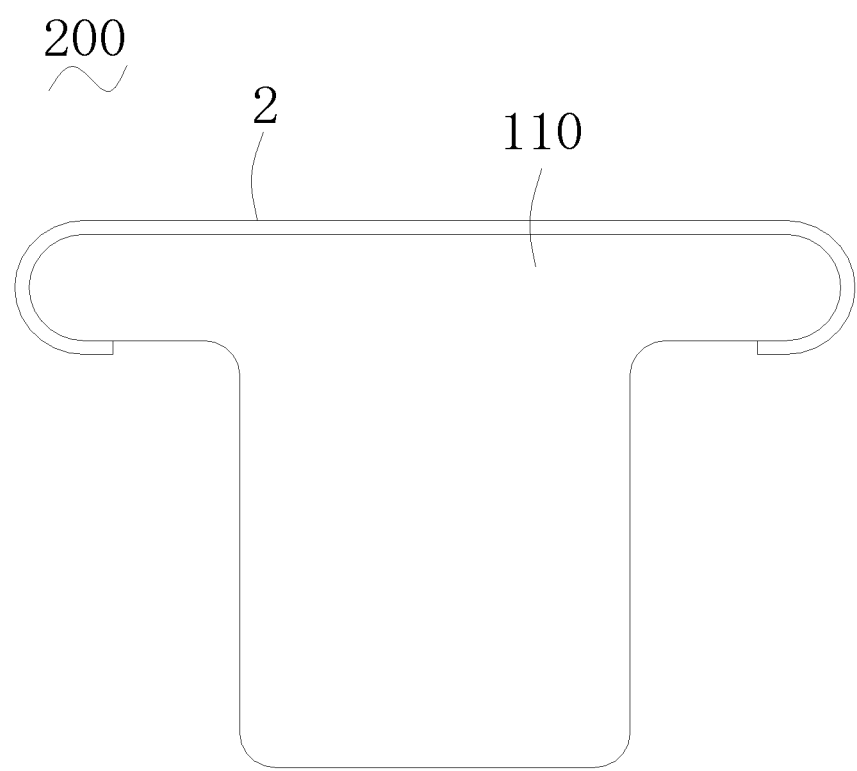
FIG. 5 is a cross-sectional view of an initial body according to an embodiment of the present disclosure.

In step S20, referring to FIG. 5, the flexible screen 2 is adsorbed on an outer side of the pressing surface of the bonding body 110 to obtain an initial body 200.

Preferably, an adsorption pressure for vacuum adsorption ranges from −60 kPa to −80 kPa, preferably −80 kPa.

Figure 6:
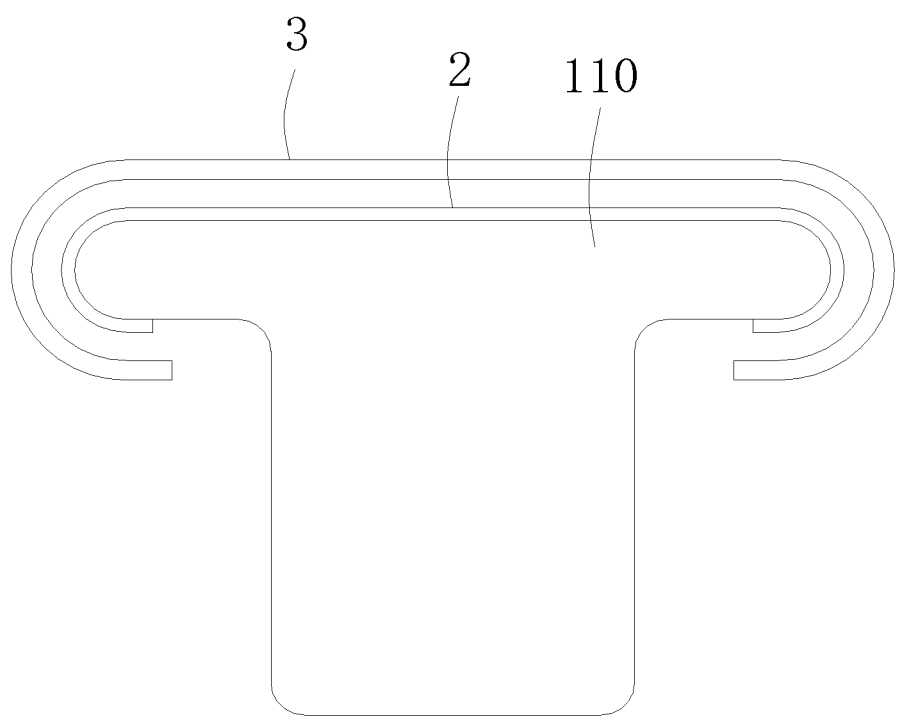
FIG. 6 is a cross-sectional view showing an initial pressing of the initial body of FIG. 5 and the irregular-shaped curved cover plate.

In step S30, referring to FIG. 6, the initial body 200 is translated from an end of the irregular-shaped curved cover plate 3 into an inner side of the irregular-shaped curved cover plate 3, or is inserted from a side of the irregular-shaped curved cover plate 3 into the inner side of the irregular-shaped curved cover plate 3, or may be inserted into the inner side of the irregular-shaped curved cover plate 3 in other ways. Afterwards, referring to FIG. 7, the expansion component 113 is expanded to press the flexible screen 2 onto the irregular-shaped curved cover plate 3, until the bonding of the irregular-shaped curved cover plate 3 and the flexible screen 2 is completed.

Figure 7:
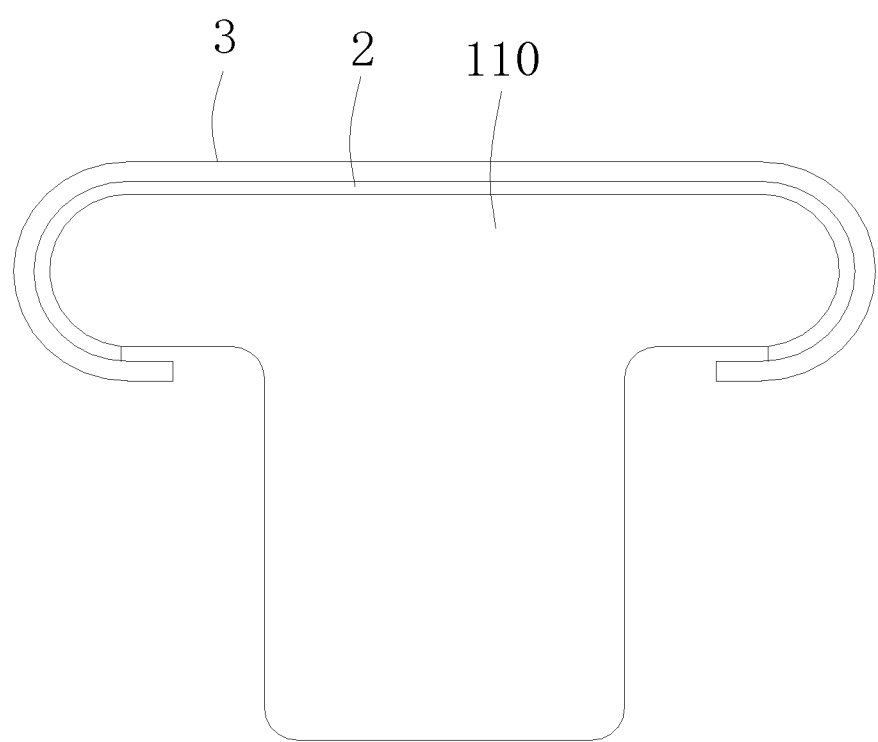
FIG. 7 is a cross-sectional view showing a bonding of a flexible screen and an irregular-shaped curved cover plate by the bonding device of FIG. 2.

The expansion component 113 in FIG. 6 is in the normal state, and the size of the pressing surface is less than the size of the irregular-shaped curved cover plate 3 at this time. The expansion component 113 in FIG. 7 is in the expanded state, and the size of the pressing surface is adapted to the size of the irregular-shaped curved cover plate 3 at this time.

More preferably, the operation of expanding the expansion component 113 is filling gas into the expansion component 113 to expand the expansion component. Specifically, the expansion component 113 is connected to the compressed air (CDA), and the expansion component 113 is filled with gas by the CDA.

Of course, the expansion component 113 can be expanded in other ways. For example, a telescopic member is provided in an interior of each of the sub-expansion components 114, when the telescopic member is extended, pressure may be applied to an inner wall of the sub-expansion component 114 to increase a volume of the sub-expansion component 114.

More preferably, prior to expanding the expansion component 113, a step of reducing the adsorption pressure of the vacuum adsorption is further included. Preferably, after the adsorption pressure of the vacuum adsorption is reduced, the adsorption pressure ranges from −5 kPa to −20 kPa, preferably −10 kPa.

In the aforementioned method of bonding the irregular-shaped curved cover plate and the flexible screen, the initial body is translated from an end of the irregular-shaped curved cover plate into an inner side of the irregular-shaped curved cover plate, or is inserted from a side of the irregular-shaped curved cover plate into the inner side of the irregular-shaped curved cover plate, such that both ends of the flexible screen are prevented from interfering with both ends of the irregular-shaped curved cover plate. In addition, in the aforementioned bonding method, the arc hook areas of the irregular-shaped curved cover plate can be sufficiently attached, thereby further improving the bonding effect.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

The foregoing descriptions are merely specific embodiments of the present invention, but are not intended to limit the protection scope of the present invention. Any variation or replacement readily figured out by a person skilled in the art within the technical scope disclosed in the present invention shall all fall within the protection scope of the present invention. Therefore, the protection scope of the present invention shall be subject to the protection scope of the appended claims.

The invention claimed is:

1. A bonding device for bonding an irregular-shaped curved cover plate and a flexible screen, wherein: the irregular-shaped curved cover plate comprises a first flat area and first arc hook areas formed by inwardly bending both sides of the first flat area, the bonding device comprises a bonding body configured to press the flexible screen, the bonding body comprises:
an adsorption component adsorbing the flexible screen, the adsorption component comprises a plurality of sub-adsorption components arranged apart from each other; and
an expansion component having a variable size and comprising a plurality of sub-expansion components arranged apart from each other, the sub-expansion components are made of rubber materials, each of the sub-expansion components is provided with an inflation hole to enable the expansion component to have a variable size;
wherein:
the adsorption component and the expansion component are cooperatively provided with a pressing surface having a shape matching with a shape of an inner surface of the irregular-shaped curved cover plate, the pressing surface has a second flat area and second arc hook areas corresponding to the first flat area and the first arc hook areas, respectively, the second arc hook areas each having an end portion, wherein the end portions of the second arc hook areas are directly below corresponding portions of the first flat area; the second flat area and the second arc hook areas cooperatively configured to adsorb the flexible screen, the expansion component has a normal state and an expanded state, in the normal state, a size of the pressing surface is less than a size of the inner surface of the irregular-shaped curved cover plate, and in the expanded state, the size of the pressing surface matches with the size of the inner surface of the irregular-shaped curved cover plate;

the bonding body further comprises a support body supporting the adsorption component and the expansion component, the support body comprising a lateral extending body extending along the pressing surface and having a shape matching with the shape of pressing surface, and a longitudinal extending body supporting the lateral extending body; and the plurality of sub-adsorption components and the plurality of sub-expansion components are distributed among the second flat area and the second arc hook areas, wherein each end portion of each of the second arc hook areas comprises at least a sub-adsorption component.

2. The bonding device according to claim 1, wherein the plurality of sub-adsorption components and the plurality of sub-expansion components are respectively strip-shaped.

3. The bonding device according to claim 1, wherein the sub-adsorption components and the sub-expansion components are alternately arranged with each other.

4. The bonding device according to claim 1, wherein the sub-expansion component has a width greater than a width of the sub-adsorption component.

5. The bonding device according to claim 1, wherein each of the sub-adsorption components is provided with a plurality of vacuum adsorption holes arranged linearly on a surface thereof.

6. The bonding device according to claim 1, wherein at least a portion of the lateral extending body is made of a material that is the same as a material of the expansion component.

7. The bonding device according to claim 6, wherein the longitudinal extending body is provided with an inflation air passage in communication with the expansion component, and an evacuated air passage in vacuum communication with the adsorption component.

8. The bonding device according to claim 1, further comprising a cover plate positioning fixture having the irregular-shaped curved cover plate located on.

9. The bonding device according to claim 1, wherein each of the second arc hook areas is substantially U-shaped.

* * * * *